United States Patent
Jeong

(10) Patent No.: US 9,859,857 B2
(45) Date of Patent: Jan. 2, 2018

(54) DC OFFSET CANCELLATION CIRCUIT

(71) Applicant: FCI Inc., Seongnam-si (KR)

(72) Inventor: SeongHun Jeong, Sungnam (KR)

(73) Assignee: FCI Inc., Bundang-Gu, Seongnam-Si, Gyeonggi-Do (KR)

( * ) Notice: Subject to any disclaimer, the term of this patent is extended or adjusted under 35 U.S.C. 154(b) by 0 days.

(21) Appl. No.: 15/488,365

(22) Filed: Apr. 14, 2017

(65) Prior Publication Data

US 2017/0302238 A1    Oct. 19, 2017

(30) Foreign Application Priority Data

Apr. 15, 2016   (KR) .................. 10-2016-0046406

(51) Int. Cl.
*H04B 1/06* (2006.01)
*H03F 3/45* (2006.01)
*H03G 3/30* (2006.01)
*H03F 3/189* (2006.01)

(52) U.S. Cl.
CPC ......... *H03F 3/45968* (2013.01); *H03F 3/189* (2013.01); *H03F 3/45596* (2013.01); *H03F 3/45744* (2013.01); *H03F 3/45748* (2013.01); *H03F 3/45892* (2013.01); *H03G 3/3026* (2013.01); *H03G 3/3047* (2013.01); *H03G 3/3052* (2013.01); *H03F 2200/294* (2013.01); *H03G 2201/202* (2013.01); *H03G 2201/40* (2013.01)

(58) Field of Classification Search
CPC ............. H03F 3/45968; H03F 3/45748; H03F 3/45744; H03F 3/189; H03F 3/45596; H03G 3/3052; H03G 3/3047; H03G 3/3026; H04B 2001/305
See application file for complete search history.

(56) References Cited

U.S. PATENT DOCUMENTS

| | | | | |
|---|---|---|---|---|
| 2002/0180520 A1* | 12/2002 | Ueno | ................... | H03F 3/2171 330/10 |
| 2007/0259638 A1* | 11/2007 | Kim | ........................ | H03G 1/04 455/251.1 |
| 2015/0022268 A1* | 1/2015 | Kao | ..................... | H03F 3/45071 330/259 |

\* cited by examiner

*Primary Examiner* — Tuan Pham
(74) *Attorney, Agent, or Firm* — Muncy, Geissler, Olds & Lowe, P.C.

(57) ABSTRACT

Disclosed herein is a DC offset cancellation circuit. The DC offset cancellation circuit includes a DC feedback unit configured to vary a DC feedback (DCFB) bandwidth to add at least one mid-bandwidth to the DCFB bandwidth and to provide a delay time in each case in order to reduce the DC droop error that occurs in switching from the high bandwidth (BW) to the mid-BW or from the mid-BW mode to the low BW mode, such that stable settling is ensured.

12 Claims, 4 Drawing Sheets

DC OFFSET CANCELLATION CIRCUIT

CROSS-REFERENCE TO RELATED APPLICATIONS

This application claims the priority of Korean Patent Application No. 10-2016-0046406 filed on Apr. 15, 2016, in the Korean Intellectual Property Office, the disclosure of which is hereby incorporated by reference in its entirety.

BACKGROUND

1. Technical Field

The present disclosure relates to a circuit for cancelling an analog DC offset in a Time Division Duplex (TDD) system.

2. Description of the Related Art

The following description merely provides background information related to the present disclosure and does not constitute the prior art.

In a conventional TDD system, a signal input through an antenna is amplified by a low noise amplifier (LNA) and mixed with a carrier signal output from a frequency generator, and the mixed signal is filtered to detect a received signal. The conversion method, which directly demodulates the received high frequency signal without frequency conversion, makes the frequency of the signal received through the antenna equal to the frequency of the carrier signal, and transmits the signal output from the mixer at a DC frequency. On the other hand, in the low-IF method, the signal output from the mixer is transmitted at an intermediate frequency near the DC frequency.

When there is no signal received through the antenna, that is, when there is no output of the LNA, the carrier signal received from the frequency generator may be self-mixed.

When such self-mixing occurs, the DC component is amplified due to gains of a filter, a variable gain amplifier (VGA), and a programmable gain amplifier (PGA) at the post stage. The amplified DC component may damage the transistors of the internal circuit such as the filter or the PGA.

FIG. 1 is a diagram showing a receiving circuit of a conventional TDD system.

A receiving circuit 100 of the TDD system includes a low noise amplifier (LNA) 120 configured to receive an RF signal from an antenna 110, a mixer 130 configured to mix an output signal of the LNA 120 with an intermediate frequency signal, a low pass filter (LPF) 150 configured to filter the output signal of the mixer 130, and a programmable gain amplifier (PGA) 160 configured to amplify the output signal of the LPF 150. The frequency generator 140 is configured to generate the intermediate frequency signal and supply the same to the mixer 130 such that the intermediate frequency signal is mixed with the output signal of the LNA 120.

In the conversion method as described above, it is necessary to cancel the DC offset which may be amplified by the gains of the LNA 120, the PGA 160 and the like.

SUMMARY

An aspect of the present disclosure is to provide a DC offset cancellation circuit including a DC feedback unit configured to vary a DC feedback (DCFB) bandwidth to add at least one mid-bandwidth to the DCFB bandwidth and to provide a delay time in each case in order to reduce the DC droop error that occurs in switching from the high bandwidth (BW) to the mid-BW or from the mid-BW mode to the low BW mode, such that stable settling is ensured.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a DC offset cancellation circuit includes an input signal stage for receiving an input signal, a first amplifier for receiving the input signal, amplifying the input signal and outputting the amplified signal, a DC feedback unit for receiving and filtering the amplified signal to extract and output a DC component of the amplified signal and feeding back the DC component to the first amplifier to change a DC feedback (DCFB) bandwidth to cancel a DC offset of the first amplifier, and a controller for generating a control signal for changing the DCFB bandwidth by adjusting a delay and transmitting the control signal to the DC feedback unit to reduce a DC kick voltage generated according to change in the DCFB bandwidth.

In accordance with another aspect of the present disclosure, a method for cancelling a DC offset in a communication receiver including an amplifier, a DC feedback unit and a controller includes a receiving operation of receiving an input signal, an amplifying operation of receiving the input signal, amplifying the input signal and outputting the amplified signal, a bandwidth changing operation of receiving and filtering the amplified signal, extracting and outputting a DC component of the amplified signal, feeding back the DC component to the amplifier and changing a DC feedback (DCFB) bandwidth to cancel the DC offset of the amplifier, and a control operation of adjusting a delay and transmitting a control signal for changing the DCFB bandwidth to the DC feedback unit to reduce a DC kick voltage generated according to change in the DCFB bandwidth.

The DC offset cancellation circuit according to embodiments of the present disclosure includes a DC feedback unit. Thereby, the DC offset, which can be amplified by gains of an LNA, a VGA, a PGA, and the like, may be cancelled.

According to embodiments of the present disclosure, the DC offset cancellation circuit adds at least one mid-BW to the DCFB BW, and provides a delay time in each case to reduce the DC droop error which occurs in switching from the high BW mode to the mid-BW mode or from the mid-BW to the low BW. Thereby, stable setting may be performed.

DETAILED DESCRIPTION

Figure 1:
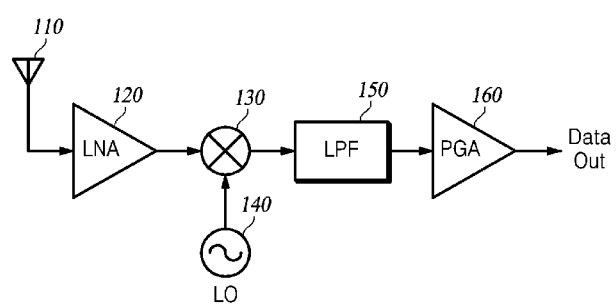
FIG. 1 is a diagram showing a receiving circuit of a conventional TDD system.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

Hereinafter, embodiments of the present disclosure will be described in detail with reference to the accompanying drawings. Throughout the drawings, like reference numerals refer to like elements.

Figure 2:
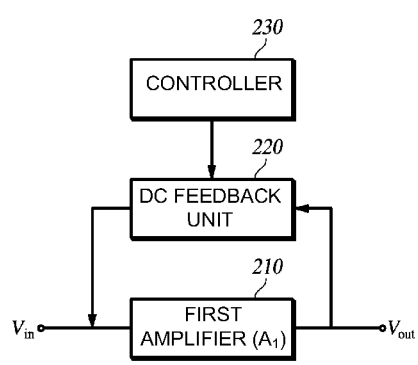
FIG. 2 is a diagram illustrating a DC offset cancellation circuit including a DC feedback unit according to an embodiment of the present disclosure.

FIG. 2 is a diagram illustrating a DC offset cancellation circuit including a DC feedback unit according to an embodiment of the present disclosure.

The DC offset cancellation circuit 200 includes a first amplifier 210, a DC feedback unit 220, and a control unit 230.

The DC offset cancellation circuit 200 cancels a DC offset that can be amplified by the gains of a low noise amplifier, a programmable gain amplifier, a variable gain amplifier, a filter, and the like. Details will be described below.

The first amplifier 210 receives an input signal $V_{in}$ and an output signal of the DC feedback unit 220 and amplifies the same to output an amplified signal $V_{out}$.

The DC feedback unit 220 receives the amplified signal $V_{out}$ of the first amplifier 210. The DC feedback unit 220 feeds back a DC component output by applying low-pass filtering to the received amplified signal $V_{out}$ to the first amplifier 210 as an input to cancel the DC offset of the first amplifier 210. The DC feedback unit 220 varies the DC feedback (DCFB) BW to stably perform the operation of cancelling the DC offset. Varying the DCFB BW, which refers to changing the cutoff frequency of the DC feedback unit 220, is performed by varying a variable resistance according to a control signal of the controller 230.

The controller 230 includes a delay cell. When the DCFB BW switches from the high BW mode to the mid-BW mode or from the mid-BW mode to the low BW mode, a DC kick voltage is generated in proportion to the amount of change in the DCFB BW. The DC kick voltage is generated due to lack of the settling time of the DC offset cancellation circuit 200. In order to reduce the DC kick voltage, a delay is added to a control signal for switching to the mid-BW mode or the low BW mode. When the delay is added to the control signal for switching from the mid-BW to the low BW mode, the DC kick voltage is reduced and the settling time of the DC offset cancellation circuit 200 is stably secured.

Figure 3:
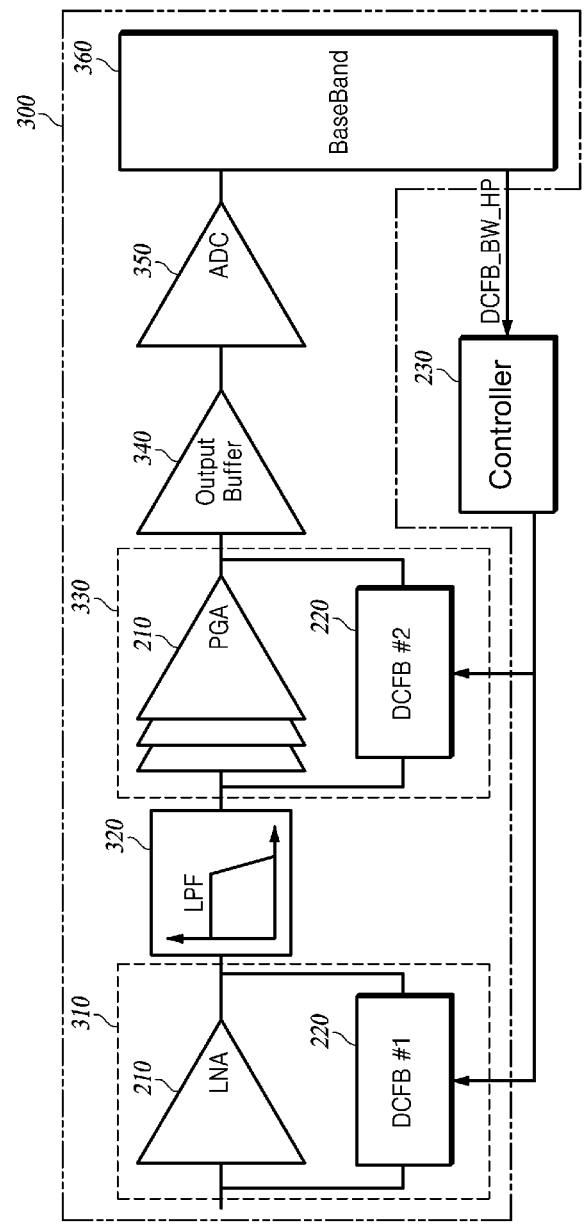
FIG. 3 is a diagram showing a receiving circuit of a TDD system according to an embodiment of the present disclosure.

FIG. 3 is a diagram showing a receiving circuit of a TDD system according to an embodiment of the present disclosure.

The receiver 300 of the TDD system includes a low noise amplifier 310, a low pass filter 320, a programmable gain amplifier 330, an output buffer 340, an Analog Digital Converter (ADC) 350, and a baseband 360.

The receiver 300 performs an automatic gain control (AGC) operation before performing a modulation operation. Here, the AGC operation refers to controlling the gain to adjust the amplitude of the output signal of the ADC 350, which is an input signal of the baseband 360, to be constant. The AGC operation should ensure that the input signal of the baseband 360 is locked within a predetermined AGC time in the receiver 300. The receiver 300 receives the DCFB_BW_HP signal of the baseband 360 in an AGC operation period, operating in the high BW mode. When the AGC operation is locked, the receiver 300 operates in the low BW mode. Here, the DCFB_BW_HP signal, which is a signal transmitted from the baseband 360 to the controller 230, indicates that the period is a period for the AGC operation. When the AGC operation is started, the DCFB_BW_HP signal becomes High. The DCFB_BW_HP signal becomes Low when the AGC operation is stopped.

The low noise amplifier 310 receives and amplifies an input signal and outputs the amplified signal to the low pass filter 320. The low noise amplifier 310 also changes the DCFB BW through the variable resistor of the first DCFB 220, using the control signal received from the controller 230.

When the AGC operation is started, the controller 230 controls the DCFB BW of the first and second DCFBs 220 to be 10 MHz. After the AGC operation is stopped, the controller 230 outputs a control signal to the first and second DCFBs 220 to change the DCFB BW to 10 kHz.

The first and second DCFBs 220 may receive the control signal from the controller 230 and add at least one mid-BW to the DCFB BW. That is, the first and second DCFBs 220 causes the DCFB BW to operate as the 10 kHz BW after passing through at least one intermediate frequency at 10 MHz. A DC kick voltage is generated when the output voltage of the receiver 300 switches from the high BW mode to the mid-BW mode or from the mid-BW mode to the low BW mode before the output voltage is settled. In order to attenuate occurrence of the DC kick voltage, the controller 230 adds a delay to the control signal for switch from the high BW mode to the mid-BW mode or from the mid-BW mode to the low BW mode, thereby securing a stable settling time for the receiver 300.

The low pass filter 320 is connected between the low noise amplifier 310 and the programmable gain amplifier 330 to receive the output voltage of the low noise amplifier 310 and pass only the lowpass signal out of the received output signal to input the lowpass signal to the programmable gain amplifier 330.

The programmable gain amplifier 330 receives the output signal of the low pass filter 320 and adjusts the gain to amplify and adjust the amplitude of the signal input to the baseband 360 to be constant. The programmable gain amplifier 330 outputs the amplified signal to the output buffer 340. The programmable gain amplifier 330 also changes the DCFB BW using the variable resistor of the second DCFB 220 based on the control signal received from the controller 230.

The output buffer 340 is connected between the programmable gain amplifier 330 and the ADC 350 to receive and buffer the output signal of the programmable gain amplifier 330 and to transmit the buffered output signal to the ADC 350.

The ADC 350 is connected between the output buffer 340 and the baseband 360 to receive an analog output signal of the output buffer 340 and convert the same into a digital signal to transmit the converted digital signal to the input stage of the baseband 360.

The baseband 360 is connected between the ADC 350 and the controller 230. The baseband 360 receives the digital signal of the ADC 350, determines whether or not the AGC operation is locked and transmits a DCFB_BW_HP signal to the controller 230.

Figure 4:
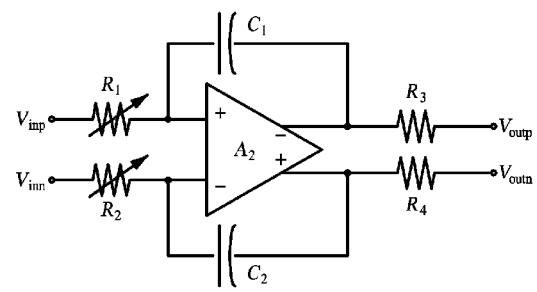
FIG. 4 shows a DC feedback unit according to an embodiment of the present disclosure.

FIG. 4 shows a DC feedback unit according to an embodiment of the present disclosure.

The DC feedback unit 220 includes an input stage $V_{inp}$, $V_{inn}$, an output stage $V_{outp}$, $V_{outn}$, a second amplifier $A_2$, a first variable resistor $R_1$, a second variable resistor $R_2$, a third resistor $R_3$, a fourth resistor $R_4$, a first capacitor $C_1$, and a second capacitor $C_2$. The constituent elements of the DC feedback unit 220 are not limited thereto. For example, the third resistor $R_3$ and the fourth resistor $R_4$ may be excluded from the configuration of FIG. 4.

The input stage $V_{inp}$, $V_{inn}$, is connected to the first amplifier 210 to receive the output signals of the first amplifier 210. The received output signals are input to the second amplifier $A_2$ via the first variable resistor $R_1$ and the second variable resistor $R_2$, respectively.

The second amplifier $A_2$ is a full differential amplifier. The second amplifier $A_2$ is not limited thereto, and may be a differential input single-ended amplifier. Hereinafter, the description given below focuses on a fully differential amplifier.

The first variable resistor $R_1$ is connected between the positive terminal $V_{inp}$ of the input stage and the positive terminal of the input stage of the second amplifier $A_2$ and outputs the DCFB BW using the control signal from the controller 230.

The second variable resistor $R_2$ is connected between the negative terminal $V_{inn}$ of the input stage and the negative terminal of the input stage of the second amplifier $A_2$ and changes the DCFB BW using the control signal from the controller 230.

The first capacitor $C_1$ is connected between the positive terminal of the input stage of the second amplifier $A_2$ and the negative terminal of the output stage of the second amplifier $A_2$ to integrate the current flowing through the first variable resistor $R_1$.

The second capacitor $C_2$ is connected between the negative terminal of the input stage of the second amplifier $A_2$ and the positive terminal of the output stage of the second amplifier $A_2$ to integrate the current flowing through the second variable resistor $R_2$.

The third resistor $R_3$ is connected between the negative terminal of the output stage of the second amplifier $A_2$ and the negative terminal of the output stage so as to shift the DCFB BW of the DC feedback unit 220.

The fourth resistor $R_4$ is connected between the positive terminal of the output stage of the second amplifier $A_2$ and the positive terminal of the output stage so as to shift the DCFB BW of the DC feedback unit 220.

Here, in the case where the first and second DC feedback units 220 are configured to process an I signal having the same phase as the input signal and a Q signal having a 90° phase difference, respectively, the DCFB BW is shifted through adjustment of the values of the third resistor $R_3$ and the fourth resistor $R_4$ by feeding back the outputs to the input stage in a crossing manner.

Figure 5:
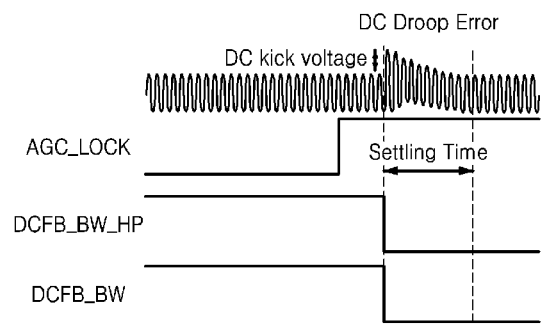
FIG. 5 illustrates an operation waveform when a DC offset cancellation circuit according to an embodiment of the present disclosure switches from the high BW mode to the low BW mode.

FIG. 5 illustrates an operation waveform when a DC offset cancellation circuit according to an embodiment of the present disclosure switches from the high BW mode to the low BW mode.

The receiver 300 of the TDD system should allow the output voltage to be locked within a predetermined Automatic Gain Control (AGC) time. The receiver 300 operates in the high BW mode by setting the DCFB_BW_HP signal to high (H) in the period during which the AGC operation is performed for quick locking.

After the AGC operation of the receiver 300 is locked, the AGC_LOCK signal becomes high (H), and the DCFB_BW_HP signal becomes low (L) after a predetermined time. When the DCFB_BW_HP signal becomes low (L), the DCFB_BW signal becomes low (L), and the DC feedback unit 220 operates in the low BW.

In the receiver 300, a DC droop error is produced when the DCFB BW is changed from a unit of tens of MHz to a unit of tens of kHz. Even if the DC droop error is produced in the receiver 300, a DC offset error may not occur. Since the DC offset error can be cancelled to tens of mV or less in the baseband 360, the DC offset error is not a serious problem if the DC kick voltage is within a threshold. However, if the DC kick voltage exceeds the threshold, an error occurs in the baseband 360. Therefore, in order for the receiver 300 to operate stably, it should be ensured that the DC kick voltage does not exceed the threshold.

Figure 6:
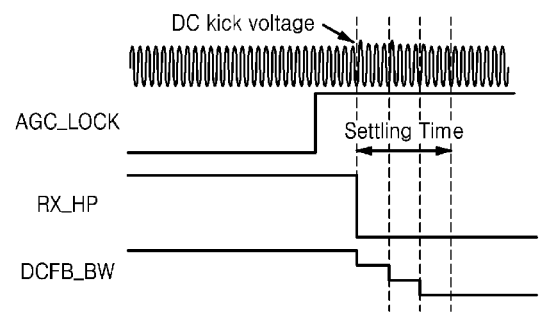
FIG. 6 illustrates an operation waveform obtained by adding a mid-BW mode in a DC offset cancellation circuit according to an embodiment of the present disclosure.

FIG. 6 illustrates an operation waveform obtained by adding a mid-BW mode in a DC offset cancellation circuit according to an embodiment of the present disclosure.

Since the DCFB BW of the DC feedback unit 220 is determined by the RC coupling frequency, the DCFB BW is converted by variation of the first variable resistor $R_1$ and the second variable resistor R2. Therefore, the DC droop error is unavoidable when the DCFB BW is converted. When the DCFB BW is converted, the DC kick voltage increases as the amount of change of the DCFB BW increases, and the settling time of the receiver 300 is determined by the frequency of the low BW. Based on this property, the DC feedback unit 220 uses the first variable resistor $R_1$ and the second variable resistor $R_2$ to add at least one mid-BW to the DCFB BW in order to reduce the DC kick voltage. For example, when the DCFB BW is changed from the 10 MHz DCFB BW to the 10 kHz DCFB BW, the DC feedback unit 220 may operate in at least one mid-BW mode of 5 MHz, 1 MHz, 100 kHz, and the like.

After the AGC operation of the receiver 300 is locked, the AGC_LOCK signal becomes high (H), and the RX_HP signal corresponding to DCFB_BW_HP becomes low (L) after a predetermined time. When the RX_HP signal becomes low (L), the DCFB_BW signal also becomes low (L), and the DC feedback unit 220 operates in the mid-BW.

If the receiver 300 switches from the high BW mode to the low BW mode before the output voltage of the receiver 300 is settled, the DC kick voltage will increase. In order to prevent the DC kick voltage from increasing, the controller 230 should add a delay to the control signal for changing the DCFB BW to the mid-BW or the low BW to secure the settling time of the receiver 300.

Figure 7:
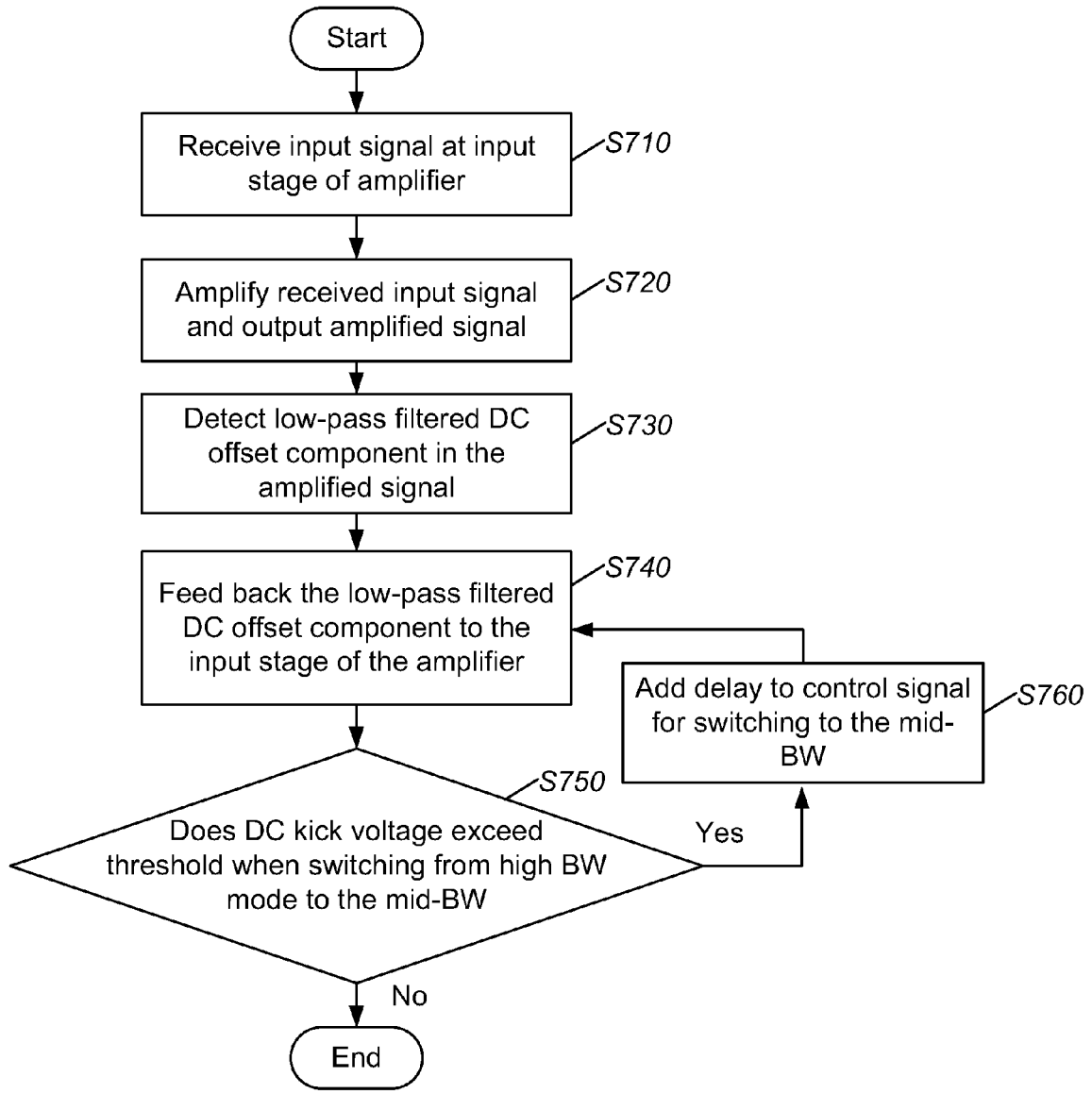
FIG. 7 is a flowchart illustrating a method for reducing the DC droop error in a DC offset cancellation circuit according to an embodiment of the present disclosure.

FIG. 7 is a flowchart illustrating a method for reducing the DC droop error in a DC offset cancellation circuit according to an embodiment of the present disclosure.

The DC offset cancellation circuit 200 receives an input signal $V_{in}$ at the input stage (first input stage) of the first amplifier 210 (S710).

The first amplifier 210 receives and amplifies the input signal and outputs the amplified signal (S720).

The DC feedback unit 220 detects a low-pass/mid-pass filtered DC offset component in the amplified signal (S730).

The DC feedback unit 220 feeds back the detected DC offset component to the input stage of the first amplifier 210 (S740).

The controller 230 controls the DC offset cancellation circuit 200 to operate in the high BW mode during a period in which the DC offset cancellation circuit 200 performs the AGC operation, such that the DC offset cancellation circuit 200 is locked within a predetermined time. After the AGC operation is locked, the controller 230 controls the DC offset cancellation circuit 200 to operate in the low BW mode. If the BW mode switches from the high BW mode to the mid-BW or low-BW mode before the output voltage of the DC offset cancellation circuit 200 is settled, the DC kick voltage will increase. Accordingly, the controller 230 determines whether or not the DC kick voltage exceeds a threshold (S750).

If the controller 230 determines that the DC kick voltage exceeds the threshold, the controller 230 adds a delay to a control signal for changing the DCFB BW to the mid-BW or low BW mode (S760). After step S760, the controller 230 repeats step S740 of sending a feedback to the input stage of the first amplifier 210. When the DC kick voltage reaches the threshold, the operation of the DC offset cancellation circuit 200 is terminated.

Although it is described in FIG. 7 that steps S710 to S760 are sequentially executed, the present disclosure is not limited thereto. FIG. 7 is not limited to the time-series order since the steps illustrated in FIG. 7 may be changed and applied or one or more steps disclosed in FIG. 7 are executable in parallel.

The above description is merely illustrative of the technical spirit of the present disclosure. It will be apparent to those skilled in the art that various modifications and variations can be made in the present disclosure without departing from the essential characteristics thereof. Therefore, the embodiments are to be construed as illustrative rather than restrictive, and the scope of the technical idea of the present disclosure is not limited by these embodiments. The scope of protection of the present embodiment should be construed according to the following claims, and all technical ideas within the scope of equivalents should be interpreted as being included in the scope of the present disclosure.

What is claimed is:

1. A DC offset cancellation circuit comprising:
   an input signal stage for receiving an input signal;
   a first amplifier for receiving the input signal, amplifying the input signal and outputting the amplified signal;
   a DC feedback unit for receiving and filtering the amplified signal to extract and output a DC component of the amplified signal and feeding back the DC component to the first amplifier to change a DC feedback (DCFB) bandwidth to cancel a DC offset of the first amplifier; and
   a controller for generating a control signal for changing the DCFB bandwidth by adjusting a delay and transmitting the control signal to the DC feedback unit to reduce a DC kick voltage generated according to change in the DCFB bandwidth.

2. The DC offset cancellation circuit according to claim 1, wherein the controller operates in a high bandwidth mode within a period for an Automatic Gain Control (AGC) operation such that the DC offset cancellation circuit is locked within a predetermined time.

3. The DC offset cancellation circuit according to claim 1, wherein the controller operates in a low bandwidth mode after the AGC operation is locked.

4. The DC offset cancellation circuit according to claim 1, wherein the controller comprises a delay cell for providing a delay to secure a settling time of the DC offset cancellation circuit.

5. The DC offset cancellation circuit according to claim 1, wherein the DC feedback unit provides at least one mid-bandwidth to the DCFB bandwidth to reduce the DC kick voltage.

6. The DC offset cancellation circuit according to claim 1, wherein the DC feedback unit comprises:
   an input stage for receiving a first output signal from the first amplifier;
   a second amplifier having a second input stage and a second output stage, the second amplifier being a full differential amplifier;
   a first variable resistor connected between a positive terminal of the input stage and a positive terminal of the second input stage of the second amplifier to change the DCFB bandwidth using the control signal;
   a second variable resistor connected between a negative terminal of the input stage and a negative terminal of the second input stage of the second amplifier to change the DCFB bandwidth using the control signal;
   a first capacitor connected between the positive terminal of the second input stage of the second amplifier and a negative terminal of the second output stage of the second amplifier to integrate a current flowing through the first variable resistor; and
   a second capacitor connected between the negative terminal of the second input stage of the second amplifier and a positive terminal of the second output stage of the second amplifier to integrate a current flowing through the second variable resistor.

7. The DC offset cancellation circuit according to claim 6, wherein the DC feedback unit further comprises:
   a third resistor connected between the negative terminal of the second output stage of the second amplifier and a negative terminal of the output stage to shift the DCFB bandwidth; and
   a fourth resistor connected between the positive terminal of the second output stage of the second amplifier and a positive terminal of the output stage to shift the DCFB bandwidth.

8. A method for cancelling a DC offset in a communication receiver including an amplifier, a DC feedback unit and a controller, the method comprising:
   a receiving operation of receiving an input signal;
   an amplifying operation of receiving the input signal, amplifying the input signal and outputting the amplified signal;
   a bandwidth changing operation of receiving and filtering the amplified signal, extracting and outputting a DC component of the amplified signal, feeding back the DC component to the amplifier and changing a DC feedback (DCFB) bandwidth to cancel the DC offset of the amplifier; and
   a control operation of adjusting a delay and transmitting a control signal for changing the DCFB bandwidth to the DC feedback unit to reduce a DC kick voltage generated according to change in the DCFB bandwidth.

9. The method according to claim 8, wherein, in the control operation comprises:
   the controller operating in a high bandwidth mode within a period for an Automatic Gain Control (AGC) operation such that the DC offset cancellation circuit is locked within a predetermined time.

10. The method according to claim 8, wherein the control operation comprises:
the controller operating in a low bandwidth mode after the AGC operation is locked.

11. The method according to claim 8, wherein the control operation further comprises:
a delay operation of providing a delay to secure a settling time of the DC offset cancellation circuit.

12. The method according to claim 8, wherein the changing operation comprises:
providing at least one mid-bandwidth to the DCFB bandwidth to reduce the DC kick voltage.

* * * * *